(12) United States Patent
Kim et al.

(10) Patent No.: US 9,773,849 B2
(45) Date of Patent: Sep. 26, 2017

(54) TRANSPARENT DISPLAY DEVICE

(71) Applicant: LG DISPLAY CO., LTD., Seoul (KR)

(72) Inventors: EuiTae Kim, Paju-si (KR); Namwook Cho, Paju-si (KR); Hyoung-Su Kim, Anyang-si (KR); DooHyun Yoon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/202,016

(22) Filed: Jul. 5, 2016

(65) Prior Publication Data

US 2017/0062535 A1 Mar. 2, 2017

(30) Foreign Application Priority Data

Aug. 24, 2015 (KR) .......................... 10-2015-0118766

(51) Int. Cl.
*H01L 27/32* (2006.01)
*H01L 51/52* (2006.01)

(52) U.S. Cl.
CPC ........ *H01L 27/3246* (2013.01); *H01L 27/326* (2013.01); *H01L 27/3216* (2013.01); *H01L 27/3218* (2013.01); *H01L 27/3276* (2013.01); *H01L 51/5234* (2013.01); *H01L 51/5284* (2013.01); *H01L 2251/5323* (2013.01)

(58) Field of Classification Search
CPC ................................................ H01L 27/3246
See application file for complete search history.

(56) References Cited

U.S. PATENT DOCUMENTS

| | | | | |
|---|---|---|---|---|
| 7,068,247 B2* | 6/2006 | Nakanishi | ........... | G02F 1/13454 315/169.3 |
| 7,737,629 B2* | 6/2010 | Okuyama | .............. | B82Y 10/00 313/498 |
| 9,024,362 B2* | 5/2015 | Kim | ....................... | H01L 51/441 257/186 |
| 2002/0075207 A1* | 6/2002 | Yudasaka | ............. | G09G 3/3225 345/76 |
| 2004/0113545 A1 | 6/2004 | Pang et al. | | |
| 2004/0251465 A1 | 12/2004 | Yamazaki et al. | | |
| 2005/0062409 A1 | 3/2005 | Yamazaki et al. | | |
| 2005/0243258 A1* | 11/2005 | Oh | .......................... | G02F 1/05 349/143 |
| 2009/0046189 A1* | 2/2009 | Yin | ................... | H01L 27/14603 348/308 |

(Continued)

FOREIGN PATENT DOCUMENTS

EP 1607931 A1 12/2005

*Primary Examiner* — Thao P Le
(74) *Attorney, Agent, or Firm* — Dentons US LLP

(57) ABSTRACT

Disclosed is a transparent display device that includes a plurality of column lines and a plurality of horizontal lines crossing each other to define a plurality of pixel regions in a matrix, each column line including at least two data lines and a voltage line, and each horizontal line including a gate line; a first transparent electrode in each emission region; a transparent organic light emitting layer on the first electrode; and a second transparent electrode on the organic light emitting layer, wherein each pixel region includes a transmissive region and a circuit region, and wherein the transmissive region includes at least two emission regions that are divided by a first transparent bank pattern.

13 Claims, 11 Drawing Sheets

(56) References Cited

U.S. PATENT DOCUMENTS

| | | | | |
|---|---|---|---|---|
| 2009/0078941 A1* | 3/2009 | Tsai | H01L 27/3246 | 257/72 |
| 2010/0096677 A1* | 4/2010 | Inoue | H01L 27/14623 | 257/294 |
| 2011/0062859 A1* | 3/2011 | Kawamura | H01L 27/322 | 313/504 |
| 2011/0079783 A1* | 4/2011 | Choi | H01L 27/3258 | 257/59 |
| 2011/0149224 A1* | 6/2011 | Tseng | G02F 1/134309 | 349/142 |
| 2012/0286137 A1* | 11/2012 | Yamaguchi | H01L 27/14607 | 250/208.1 |
| 2012/0293736 A1* | 11/2012 | Jung | G09G 3/2074 | 349/37 |
| 2013/0002638 A1* | 1/2013 | Missbach | G02B 27/22 | 345/211 |
| 2013/0075744 A1* | 3/2013 | Shiobara | H01L 51/5284 | 257/72 |
| 2013/0119413 A1* | 5/2013 | Harada | H01L 51/5048 | 257/88 |
| 2013/0134474 A1* | 5/2013 | Takeuchi | H01L 33/42 | 257/99 |
| 2013/0320309 A1* | 12/2013 | Kim | H01L 51/441 | 257/40 |
| 2014/0246707 A1* | 9/2014 | Koo | H01L 27/14614 | 257/230 |
| 2014/0284564 A1* | 9/2014 | Kim | H01L 27/3276 | 257/40 |
| 2016/0055807 A1* | 2/2016 | Lee | G02F 1/134336 | 345/205 |
| 2016/0370635 A1* | 12/2016 | Tanaka | G02F 1/1368 | |

* cited by examiner

TRANSPARENT DISPLAY DEVICE

CROSS-REFERENCE TO RELATED APPLICATIONS

This application claims priority to and benefit from Korean Patent Application No. 2015-0118766 filed on Aug. 24, 2015.

BACKGROUND

Field of Disclosure

The present disclosure relates to a transparent display device and a method of manufacturing the same.

Description of the Related Art

With progress to the information-oriented society, various demands for display devices for displaying an image are increasing. Recently, various kinds of display devices such as a liquid crystal display device, a plasma transparent display panel device, and an organic light emitting display device have been used.

Further, in recent years, display devices have been actively developed. Accordingly, display devices, which have various designs differentiated from a conventional design with an improved aesthetic function and user functions, have been discussed. For example, a transparent display device has been suggested.

In order to increase an emission efficiency of a transparent display device, a reflective plate is typically used. In a transparent display device using a reflective plate, if a panel design is changed to increase transparency, an emission area may become, however, decreased and thus, the emission efficiency may also be decreased. On the contrary, if the emission efficiency is increased by increasing the emission area, transparency, the main function of the transparent display device, may become decreased.

Further, when a reflective plate is used in a transparent display device, a color filter substrate including a color filter layer is typically used to suppress reflection of the reflective plate, which accompanies a process for bonding the color filter substrate to a substrate including a plurality of active elements. Such a process for bonding the color filter substrate to the substrate including a plurality of active elements may require high precision.

BRIEF SUMMARY

Accordingly, the present disclosure is directed to a transparent display device and a method of manufacturing the same that substantially obviate one or more problems due to limitations and disadvantages of the related art.

An advantage of the present disclosure is to provide a transparent display device with improved brightness.

Additional advantages and features of the present disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, a transparent display device may, for example, include a plurality of column lines and a plurality of horizontal lines crossing each other to define a plurality of pixel regions in a matrix, each column line including at least two data lines and a voltage line, and each horizontal line including a gate line; a first transparent electrode in each emission region; a transparent organic light emitting layer on the first electrode; and a second transparent electrode on the organic light emitting layer, wherein each pixel region includes a transmissive region and a circuit region, and wherein the transmissive region includes at least two emission regions that are divided by a first transparent bank pattern.

Herein, one pixel region includes at least two sub-pixel regions. The two sub-pixel regions are divided by a first bank pattern. Further, the one pixel region includes at least one transmissive region. The transmissive region includes at least two emission regions.

Herein, the first bank pattern may be formed of a transparent organic material. Further, the circuit regions may be disposed on the horizontal lines, and a second bank pattern may be disposed to be overlapped on the circuit regions. Furthermore, the column lines including the plurality of data lines may also be disposed to be overlapped with the second bank pattern or a black matrix. Herein, the second bank pattern may be formed of an opaque material. Optionally, the opaque material may be organic.

A transparent display device according to the present disclosure includes an emission region as a transmissive region. Thus, an area of the transmissive region can be secured regardless of an emission area of the display device.

Further, in the transparent display device according to the present disclosure, all of circuits required for the display device are disposed in a circuit region disposed under the transmissive region and the emission region. Thus, an opaque circuit region can be minimized.

Furthermore, the transparent display device according to the present disclosure does not include a reflective plate. Thus, a color filter layer can be omitted and a configuration of the display device can be simplified. Also, it is easy to increase or decrease a gap between a first substrate and a second substrate.

Moreover, in the transparent display device according to the present disclosure, a bonding process for a color filter substrate including a color filter can be omitted. Thus, the fabrication process can be simplified.

It is to be understood that both the foregoing general description and the following detailed description are exemplary and explanatory and are intended to provide further explanation of the invention as claimed.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE ILLUSTRATED EMBODIMENTS

Figure 1:
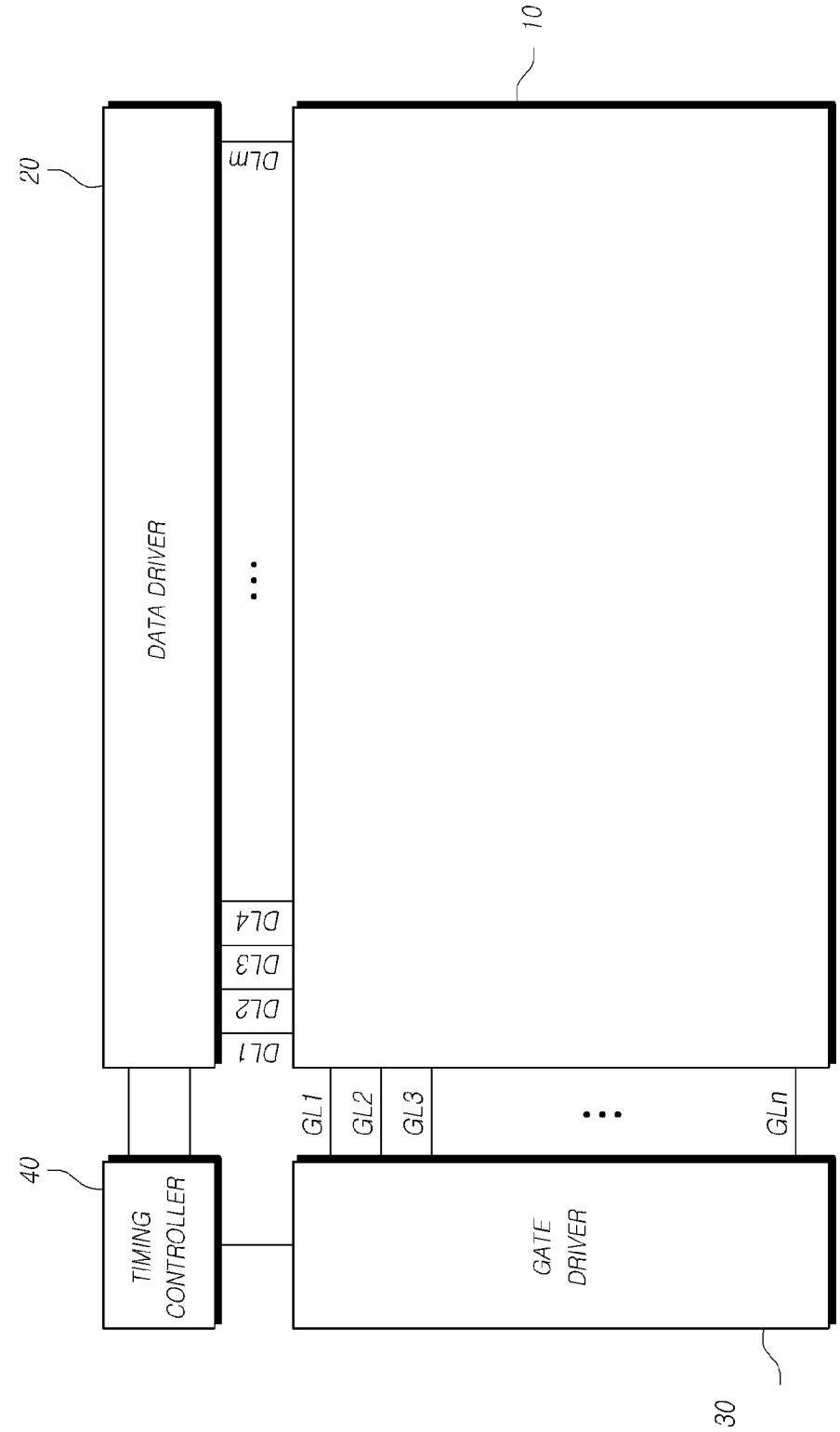
FIG. 1 is a schematic system configuration view of a transparent display device according to an embodiment of the present disclosure.

Hereinafter, exemplary embodiments of the present disclosure will be described in detail with reference to the accompanying drawings. The following exemplary embodiments are provided for sufficiently conveying the concept of the present disclosure to those skilled in the art. Therefore, the present disclosure is not limited to the following exemplary embodiments themselves but can be modified and changed in other embodiments. Further, in the drawings, the size and thickness of a device may be exaggerated for convenience. Like reference numerals generally denote like elements throughout the present specification.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the invention. The present disclosure is defined by the appended claims. Like reference numerals generally denote like elements throughout the present specification. In the drawings, the sizes and relative sizes of layers and regions may be exaggerated for clarity.

When an element or layer is referred to as being "on" another element or layer, it may be directly on the other element or layer, or intervening elements or layers may be present. Meanwhile, when an element is referred to as being "directly on" another element, any intervening elements may not be present.

The spatially-relative terms such as "below", "beneath", "lower", "above", and "upper" may be used herein for ease of description to describe the relationship of one element or components with another element(s) or component(s) as illustrated in the drawings. It will be understood that the spatially relative terms are intended to encompass different orientations of the element in use or operation, in addition to the orientation depicted in the drawings. For example, if the element in the drawings is turned over, elements described as "below" or "beneath" other elements would then be oriented "above" the other elements. Thus, the exemplary term "below" can encompass both an orientation of above and below.

Further, in describing components of the present invention, terms such as first, second, A, B, (a), and (b) can be used. These terms are used only to differentiate the components from other components. Therefore, the nature, order, sequence, and the like, of the corresponding components are not limited by these terms.

FIG. 1 is a schematic system configuration view of a transparent display device according to an embodiment of the present disclosure.

Referring to FIG. 1, the transparent display device 1 includes a transparent display panel 10 in which a plurality of data lines DL to DLm and a plurality of gate lines GL1 to GLn are disposed to define a plurality of sub-pixels, a data driver 20 configured to drive a plurality of data lines DL to DLm, a gate driver 30 configured to drive a plurality of gate lines GL1 to GLn, and a timing controller 40 configured to control the data driver 20 and the gate driver 30.

The data driver 20 drives the plurality of data lines by supplying data voltages to the plurality of data lines. Further, the gate driver 30 sequentially drives the plurality of gate lines by sequentially supplying a scan signal to the plurality of gate lines.

The timing controller 40 controls the data driver 20 and the gate driver 30 by supplying control signals to the data driver 20 and the gate driver 30. The timing controller 40 starts a scan in each frame, converts image data input from the outside to be suitable for data signals used by the data driver 20, outputs the converted image data, and controls a driving of data at a proper time corresponding to the scan.

The gate driver 30 sequentially drives the plurality of gate lines by sequentially supplying an ON or OFF voltage scan signal to the plurality of gate lines according to the control of the timing controller 40. The gate driver 30 may be located at only one side of the transparent display panel 10 as illustrated in FIG. 1 or may be located at both sides thereof if desired according to the driving method or the design of the transparent display panel.

The gate driver 30 may include one or more gate driver integrated circuits. Each of the gate driver integrated circuits may be connected to a bonding pad of the transparent display panel 10 through a Tape Automated Bonding (TAB) method or a Chip On Glass (COG) method, or implemented in a Gate In Panel (GIP) type and directly disposed in the transparent display panel 10, or may be integrated and disposed in the transparent display panel 10 if desired. Alternatively, each of the gate driver integrated circuits may be implemented in a Chip On Film (COF) type. In this case, a gate driving chip corresponding to each gate driver integrated circuit may be mounted on a flexible film, and one end of the flexible film may be bonded to the transparent display panel 10.

When a specific gate line is scanned, the data driver 20 converts image data received from the timing controller 40 into analog data voltages and supplies the data voltages to the plurality of data lines.

The data driver 20 may include at least one source driver integrated circuit to drive the plurality of data lines. Each source driver integrated circuit may be connected to a bonding pad of the transparent display panel 10 through a Tape Automated Bonding (TAB) method or a Chip On Glass (COG) method, or directly disposed in the transparent display panel 10, or may be integrated and disposed in the transparent display panel 10 if desired. Alternatively, each source driver integrated circuit may be implemented in a Chip On Film (COF) type. In this case, a source driving chip corresponding to each source driver integrated circuit may be mounted on a flexible film, and one end of the flexible film may be bonded to at least one source printed circuit board and the other end thereof may be bonded to the transparent display panel 10.

The source printed circuit board may be connected to a control printed circuit board through a connector such as a flexible flat cable (FFC) or a flexible printed circuit (FPC). The timing controller 40 is disposed in the control printed circuit board. Further, in the control printed circuit board, a power controller (not illustrated) configured to supply a voltage or a current to the transparent display panel 10, the data driver 20, the gate driver 30, and the like, or control a voltage or a current to be supplied may be further disposed. The above-described source printed circuit board and control printed circuit board may be formed as one printed circuit board.

The transparent display device 1 may be a liquid crystal display device, an organic light emitting display device, and the like. In the exemplary embodiments, the dual-type transparent display device 1 is described as an organic light emitting display device by way of example.

Meanwhile, a plurality of sub-pixels may be disposed in an RGB structure, or a plurality of sub-pixels may be disposed, for example, in a 2P-4SP structure in which two pixels include four sub-pixels. This structure can be applied to all of the following exemplary embodiments of the present disclosure. With the 2P-4SP structure, it may be possible to express the same resolution with fewer sub-pixels as compared with the RGB structure. Further, since the number of sub-pixels is reduced, the transparency of the transparent display device 1 can be improved.

The 2P-4SP structure applied to the transparent display device according to the exemplary embodiments of the present disclosure may include an RG-BG structure or an RG-BW structure, but is not limited thereto. In the following exemplary embodiments, the RG-BG structure using sub-pixels of three colors will be mainly described by way of example.

Figure 2:
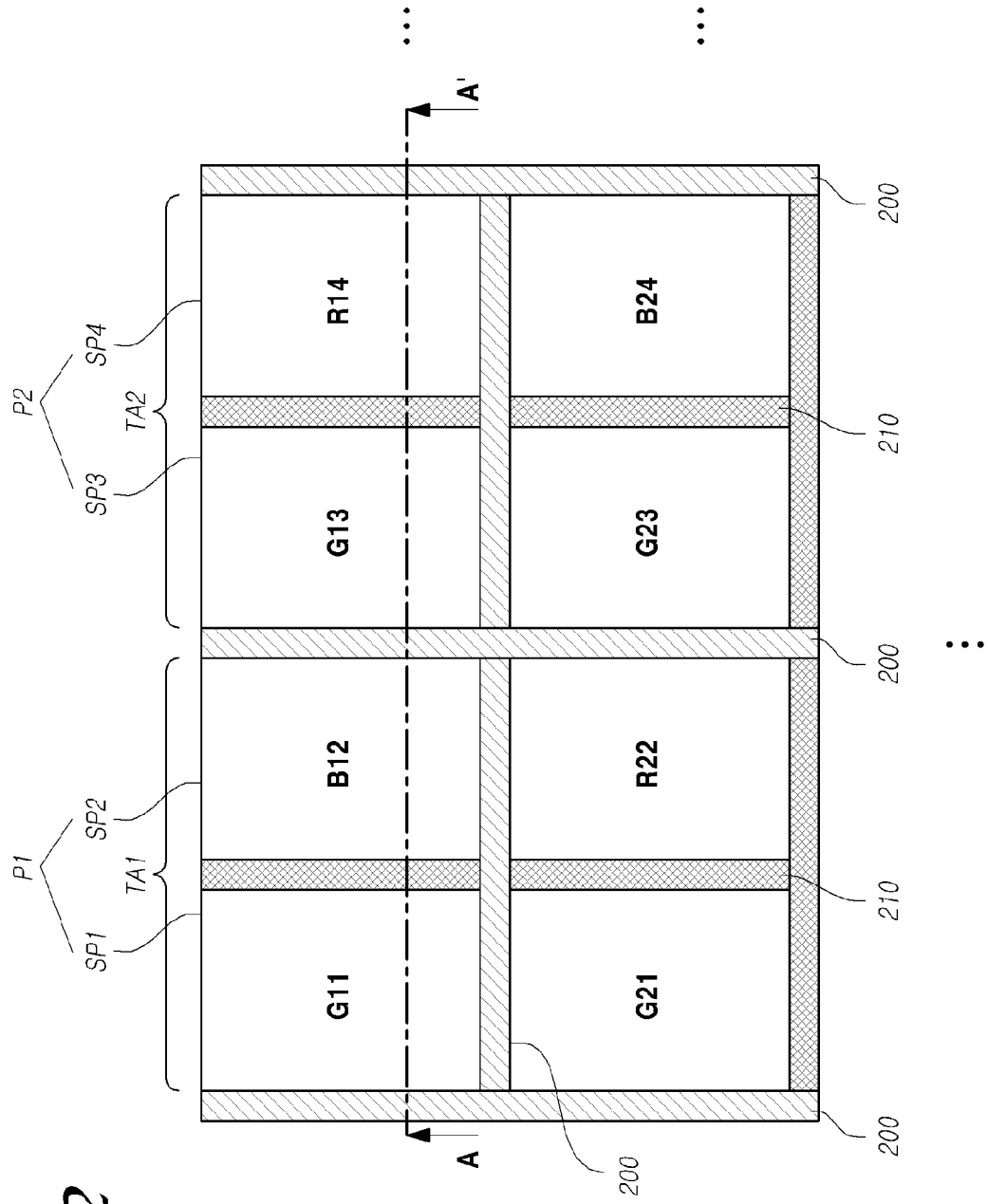
FIG. 2 is a plane view of a transparent display device according to a first exemplary embodiment of the present disclosure.

A transparent display device according to a first exemplary embodiment will be described in detail with reference to FIG. 2. FIG. 2 is a plane view of the transparent display device according to the first exemplary embodiment of the present disclosure.

Referring to FIG. 2, a plurality of sub-pixel regions are defined at a region where a plurality of data lines and a plurality of gate lines cross each other. Herein, if two of the plurality of data lines and at least one voltage line are referred to as a column line, the column line may be disposed in each pixel region P. Further, pixel regions may be disposed in a matrix by a plurality of column lines crossing a plurality of horizontal lines including the gate lines.

In the transparent display device according to the first exemplary embodiment of the present disclosure, two pixel regions may include four sub-pixel regions. That is, two sub-pixel regions may constitute one pixel region. Herein, one pixel region may be divided into two sub-pixel regions by a first bank pattern 210. For example, a first sub-pixel region SP1 and a second sub-pixel region SP2 may be divided by the first bank pattern 210, and the first sub-pixel region SP1 and the second sub-pixel region SP2 may constitute a first pixel region P1.

The one pixel region is divided into a transmissive region and an opaque region as a region except the transmissive region. Herein, the transmissive region includes emission regions, and the opaque region includes a circuit region for driving organic light emitting elements disposed in the emission regions.

For example, the first pixel region P1 includes a first transmissive region TA1 and an opaque region that is a rest of the region except the first transmissive region TA1. Further, in one pixel region, each of two sub-pixel regions divided by the first bank pattern 210 may include a sub-pixel emission region and a sub-pixel circuit region.

A plurality of sub-pixel regions SP1, SP2, SP3, SP4, . . . configured as described above may be disposed in a vertical direction and a horizontal direction with respect to a display area of the transparent display device. The horizontal direction is perpendicular to the vertical direction. As a result, the plurality of sub-pixel regions SP1, SP2, SP3, SP4, . . . may be disposed in a matrix. Accordingly, the plurality of transmissive regions may also be disposed in a matrix, an example of which is a pattern of rectangular shapes.

To be specific, a transparent display device according to an embodiment of the present disclosure may include the first sub-pixel region SP1 including a first emission region G11, the second sub-pixel region SP2 including a second emission region B12, a third sub-pixel region SP3 including a third emission region G13, and a fourth sub-pixel region SP4 including a fourth emission region R14. The sub-pixel regions SP1, SP2, SP3, and SP4 may be alternately disposed in the horizontal direction.

Further, sub-pixels including emission regions G11, G21, . . . that emit lights of a same color may be disposed in a first column, and sub-pixels including emission regions B12, R22, . . . that emit lights of different colors may be disposed in a second column. Also, sub-pixels including emission regions G13, G23, . . . that emit lights of a same color may be disposed in a third column, and sub-pixels including emission regions B14, R24, . . . that emit lights of different colors may be disposed in a fourth column. With this configuration, different colors can be mixed appropriately.

A location of a sub-pixel region in the display device according to an embodiment of the present disclosure is not limited thereto, and sub-pixels including emission regions that emit lights of a same color may be disposed in the same vertical direction. In the following exemplary embodiments, a configuration in which sub-pixels including emission regions that emit lights of a same color and sub-pixels including emission regions that emit lights of different colors are alternately disposed in a vertical direction will be mainly described by way of example for convenience in explanation.

In this embodiment, the one transmissive region includes two emission regions. The two emission regions disposed on the one transmissive region may be divided by the first bank pattern 210. Herein, the first bank pattern 210 may be a transparent bank pattern 210 formed of a transparent organic material. For example, in the first transmission region TA1 disposed in the first pixel region P1, the first emission region G11 and the second emission region B12 are divided by the first bank pattern 210. That is, the first bank pattern 210 may be disposed between the first emission region G11 and the second emission region B12.

That is, a transmissive region in one pixel region is the same as a region where two emission regions and the first bank pattern 210 are disposed. For example, the first transmissive region in the first pixel region P1 is the same as a region where the first emission region G11, the second emission region B12, and the first bank pattern 210 are disposed. As such, the first bank pattern 210 is formed as a transparent bank pattern. Thus, the transmissive region in the pixel region can be extended.

Further, an opaque region disposed on the one pixel region may include a circuit region. The circuit region may be disposed on a horizontal line including a data line. As such, the circuit region is disposed on the horizontal line. Thus, an area of the circuit region can be reduced or minimized. Accordingly, areas of the transmissive region and the emission region can be increased.

Herein, the circuit region may overlap a second bank pattern 200. To be specific, the circuit region may be disposed under the second bank pattern 200. Herein, the second bank pattern 200 may be a bank pattern formed of an opaque organic material. Preferably, the second bank pattern 200 may be a black bank pattern.

Further, column lines including two data lines and at least one voltage line may also overlap the second bank pattern 200. To be specific, the column lines may be disposed under the second bank pattern 200. As such, the second bank pattern 200 is disposed to be overlapped with the circuit region and the column lines. Thus, it may be possible to reduce or block a reflected light from metal lines and metal electrodes. Further, a column line is disposed in each pixel region including two sub-pixel regions. Thus, a column line region can be reduced as compared with a configuration in which a column line is disposed in each sub-pixel region. That is, an opaque region of the display device can be reduced.

Meanwhile, the emission regions disposed in the pixel regions may have the same area. For example, the first to fourth emission regions G11, B12, G13, and R14 disposed in the first pixel region P1 and the second pixel region P2 may have the same area. Accordingly, an amount of light emitted from each of the first to fourth emission regions G11, B12, G13, and R14 may be uniform.

Figure 3:
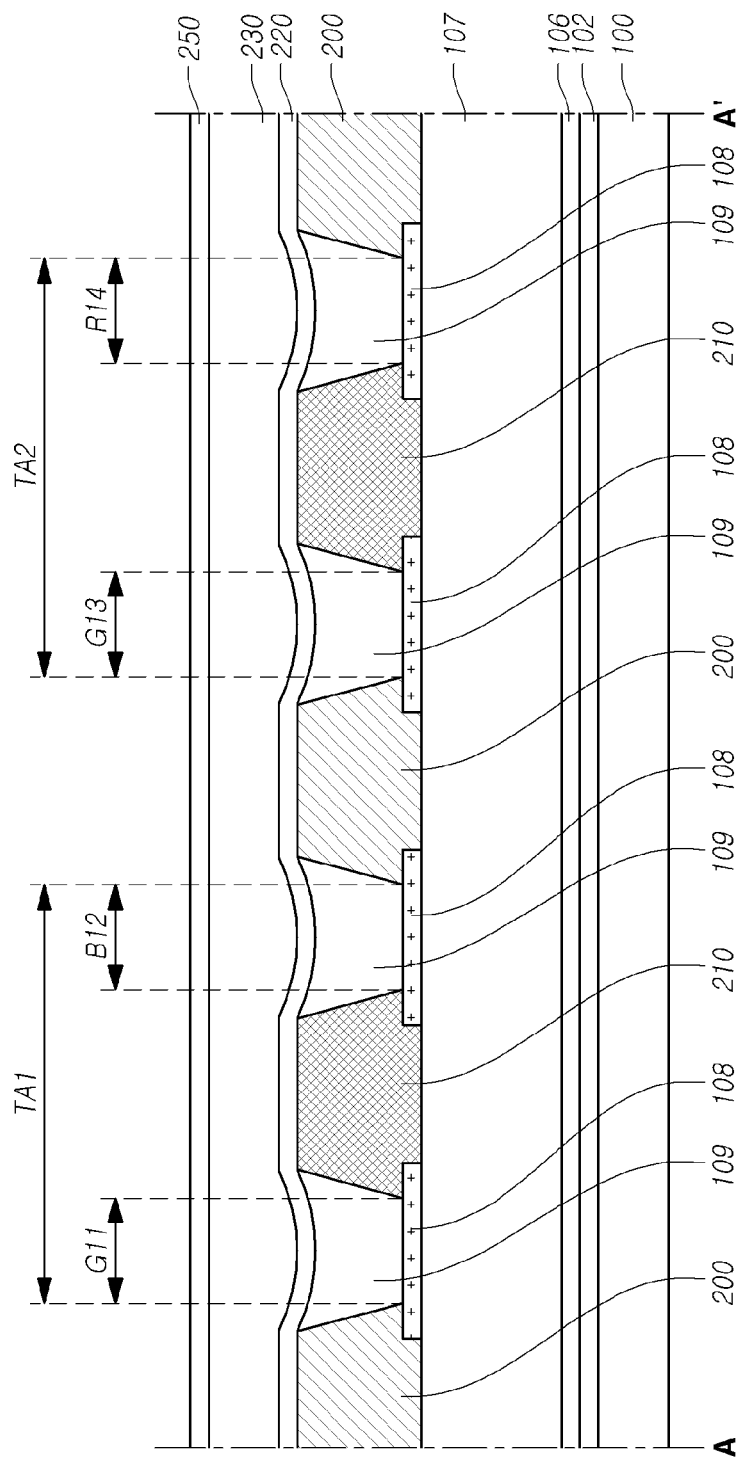
FIG. 3 is a cross-sectional view taken along a line A-A' of the transparent display device according to the first exemplary embodiment of the present disclosure.

The above-described configuration will be described in detail with reference to a cross-sectional view taken along line A-A' of the transparent display device according to the first exemplary embodiment of the present disclosure. FIG. 3 is the cross-sectional view taken along line A-A' of the transparent display device according to the first exemplary embodiment of the present disclosure.

Referring to FIG. 3, in the transparent display device according to the first exemplary embodiment of the present disclosure, a plurality of insulation films are disposed on a first substrate 100. For example, a first insulation film 102, a second insulation film 106, and a third insulation film 107 are disposed on the first substrate 100. Herein, the substrate 100 may be formed of a transparent material, and all of the first to third insulation films 102, 106, and 107 may also be formed as transparent insulation films.

FIG. 3 illustrates a configuration in which the plurality of insulation films 102, 106, and 107 are disposed on the first substrate 100. However, the present disclosure is not limited thereto, and may also include, for example, a configuration in which an insulation film may be disposed as a single layer on the substrate 100 and a configuration in which no insulation is disposed on the first substrate 100.

A first electrode 108 of an organic light emitting element is disposed on the third insulation film 107. Herein, the first electrode 108 may be an anode electrode of the organic light emitting element. The first electrode 108 may be disposed in each of the emission regions G11, B12, G13, and R14.

The first electrode 108 may be formed of a transparent conductive material. For example, the first electrode 108 may be formed of any one of indium tin oxide (ITO), indium zinc oxide (IZO), or indium tin zinc oxide (ITZO). However, a material of the first electrode 108 is not limited thereto.

FIG. 3 illustrates a configuration in which the first electrode 108 is a single layer. However, the transparent display device according to an embodiment of the present disclosure is not limited thereto, and the first electrode 108 may be formed of multiple layers. Even if the first electrode 108 is formed of multiple layers, each layer in the first electrode 108 may be formed of a transparent conductive material.

Further, both ends of the first electrode 108 may be disposed to be overlapped with the bank patterns. To be specific, one end of the first electrode 108 may be overlapped with the first bank pattern 210 and the other end of the first electrode may be overlapped with the second bank pattern 200.

In a region of the first electrode 108 where the first bank pattern 210 and the second bank pattern 200 are not disposed, an organic light emitting layer 109 of the organic light emitting element is disposed. Herein, the organic light emitting layer 109 may be formed of a transparent organic material. A second electrode 220 of the organic light emitting element is disposed on the organic light emitting layer 109 and the first and second bank patterns 210 and 200. Herein, the second electrode 220 may be a cathode electrode of the organic light emitting element.

Further, the second electrode 220 may be formed of a transparent conductive material. For example, the second electrode 220 may be formed of one of indium tin oxide (ITO), indium zinc oxide (IZO), indium tin zinc oxide (ITZO), or a metal having a low work function. However, a material of the second electrode 220 is not limited thereto.

An encapsulation layer 230 configured to suppress infiltration of moisture and oxygen into the organic light emitting element is disposed on the second electrode 220. A second substrate 250 may be disposed on the encapsulation layer 230. Herein, the encapsulation layer 230 and the second substrate 250 may be formed of transparent materials.

Meanwhile, the first and second bank patterns 210 and 200 may define the emission regions G11, B12, G13, and R14 of the sub-pixel regions. That is, regions corresponding to partial regions of a top surface of the first electrode 108 exposed by the first and second bank patterns 210 and 200 may be defined as the emission region G11, B12, G13, R14 in the respective sub-pixel regions.

To be specific, the first bank pattern 210 may be disposed between two emission regions disposed within one transmissive region. Herein, the first bank pattern 210 may divide emission regions disposed within one transmissive region. For example, the first bank pattern 210 may be disposed between the first emission region G11 and the second emission region B12 disposed within the first transmissive region TA1. Alternatively, the first bank pattern 210 may be disposed between the third emission region G13 and the fourth emission region R14 disposed within a second transmissive region TA2.

The second bank pattern 200 may be disposed in both sides of a transmissive region. For example, the second bank pattern 200 may be disposed in both sides of the first transmissive region TA1. Alternatively, the second bank pattern 200 may be disposed in both sides of the second transmissive region TA2. Herein, the first transmissive region TA1 and the second transmissive region TA2 disposed adjacent to each other may share the second bank pattern 200.

Herein, one transmissive region may be the same as a region where two emission regions and one first bank pattern 200 are disposed. Herein, elements, such as the first substrate 100, the plurality of insulation films 101, 102, and 103, the first electrode 108, the organic light emitting layer 109, the second electrode 220, the encapsulation layer 230, and the second substrate 250, disposed on the emission regions G11, B12, G13, and R14 are formed of transparent materials. As a result, the emission regions G11, B12, G13, and R14 may also be transmissive regions.

That is, in the transparent display device according to the first exemplary embodiment of the present disclosure, the emission regions G11, B12, G13, and R14 are included as transmissive regions. Thus, an area of a transmissive region can be secured regardless of an emission area of the display device. Further, since the emission regions G11, B12, G13, and R14 are disposed in the transmissive regions, an emission area can be increased as compared with a conventional transparent display device. As such, the brightness of the transparent display device can be increased. Accordingly, a high brightness can be obtained in a dual-type transparent display device according to an embodiment of the present disclosure.

In the transparent display device according to the first exemplary embodiment of the present disclosure, the organic light emitting elements disposed in the emission regions G11, B12, G13, and R14 generate light. The light generated from the organic light emitting element is emitted to an upper side and a lower side of the organic light emitting element. Herein, the elements disposed in the emission regions G11, B12, G13, and R14 as well as the first electrode 108 and the second electrode 220 of the organic light emitting element are formed of transparent materials. As a result, the light generated from the organic light emitting element can be emitted to the outside of the first substrate 100 and the second substrate 250. Accordingly, the display device according to the first exemplary embodiment of the present disclosure can realize a dual emission.

The transparent display device according to the first exemplary embodiment of the present disclosure does not include a reflective plate. As a result, a color filter can be omitted, which simplifies the configuration of the transparent display device. Since a color filter is omitted, it may be easy to increase or decrease a gap between the first substrate 100 and the second substrate 250. Further, a bonding process for attaching a color filter substrate can also be omitted, which further simplifies the manufacturing processes.

Figure 4:
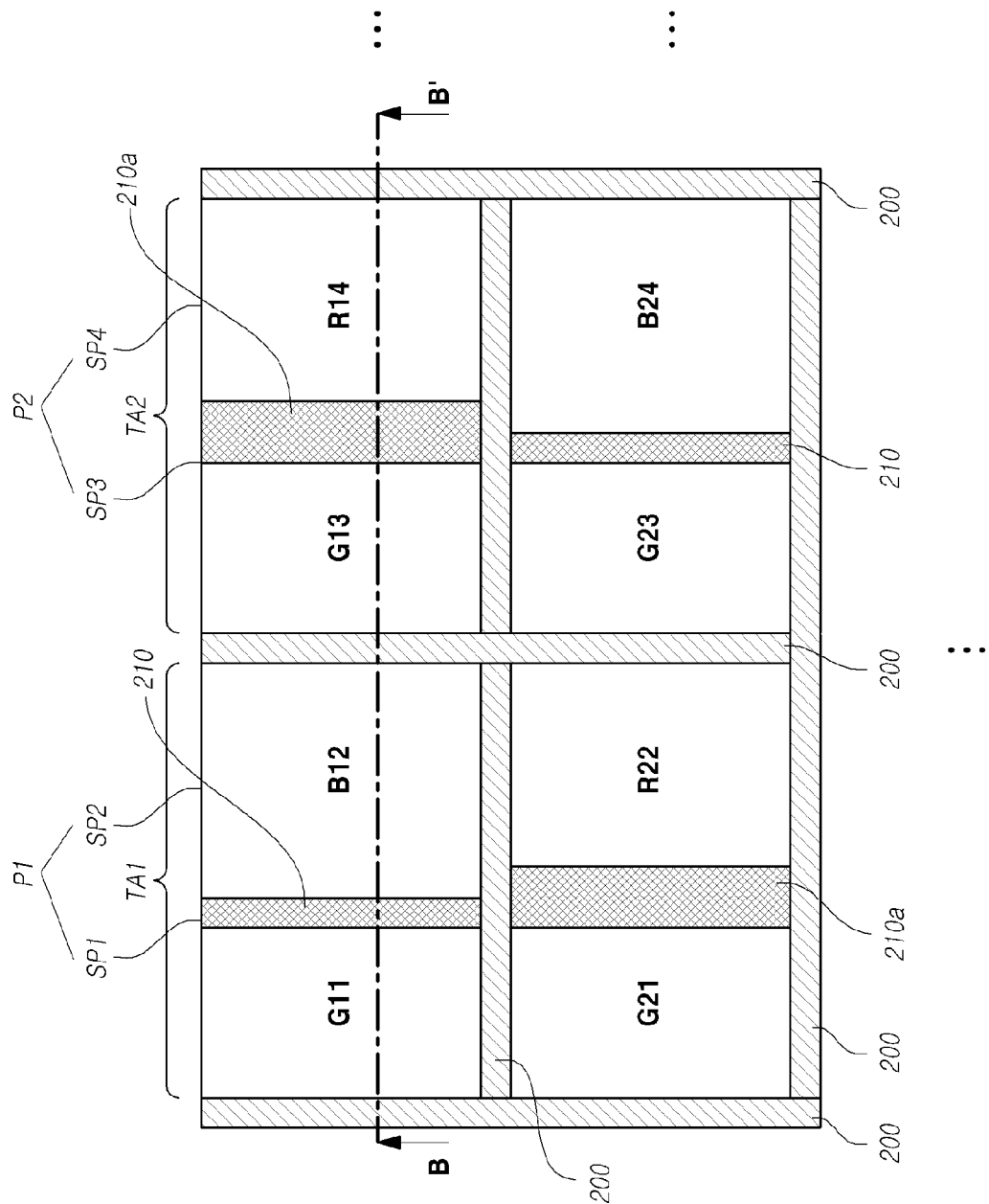
FIG. 4 is a plane view of a transparent display device according to a second exemplary embodiment of the present disclosure.
Figure 5:
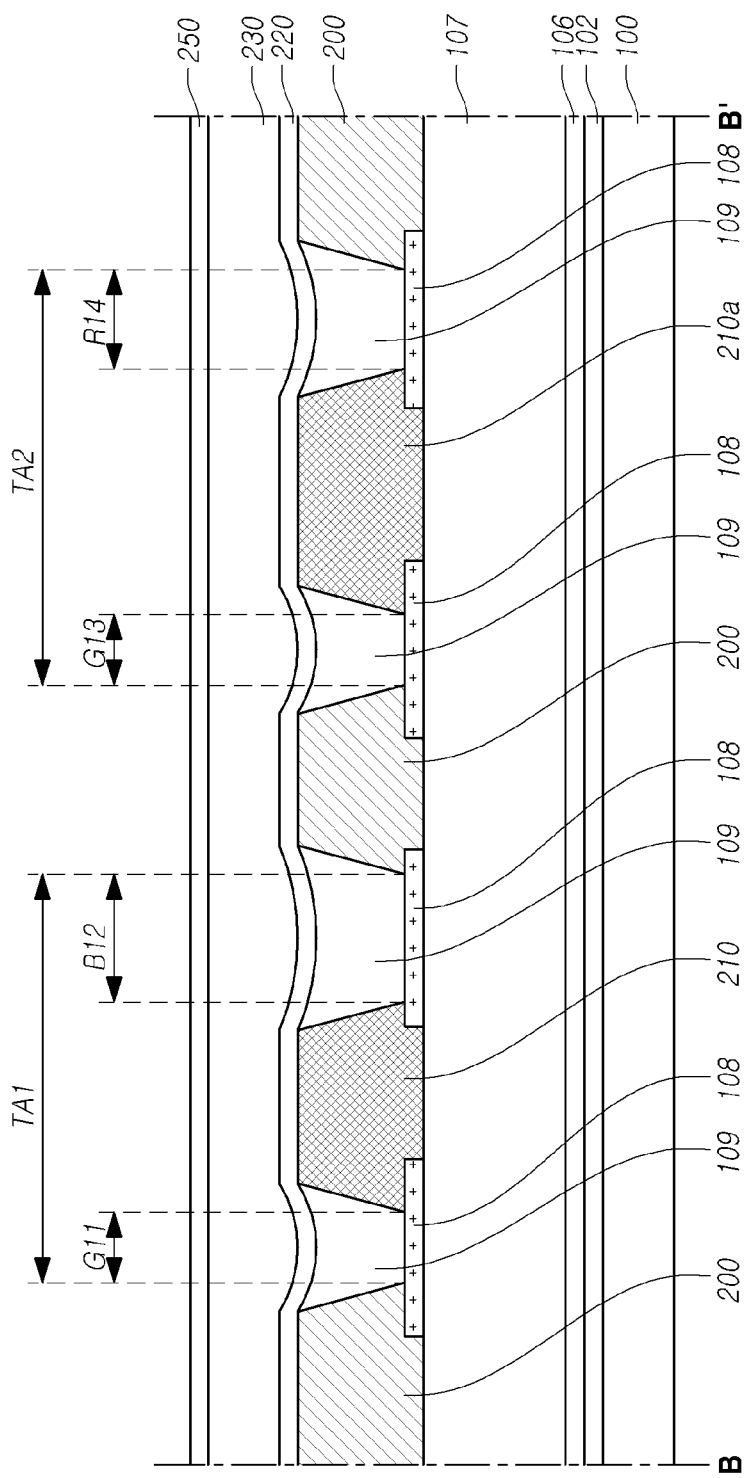
FIG. 5 is a cross-sectional view taken along a line B-B' of the transparent display device according to the second exemplary embodiment of the present disclosure.

Hereinafter, a transparent display device according to a second exemplary embodiment of the present disclosure will be described with reference to FIG. 4 and FIG. 5. FIG. 4 is a plane view of a transparent display device according to the second exemplary embodiment of the present disclosure. FIG. 5 is a cross-sectional view taken along line B-B' of the transparent display device according to the second exemplary embodiment of the present disclosure. The transparent display device according to the second exemplary embodiment may include the same components as those of the first exemplary embodiment. The redundant description thereof may be omitted herein for conciseness. Further, like components are assigned like reference numerals.

Referring to FIG. 4 and FIG. 5, two sub-pixel regions may constitute one pixel region. For example, a first sub-pixel region SP1 and a second sub-pixel region SP2 may constitute a first pixel region P1.

Further, one pixel region may include one transmissive region, and the one transmissive region may include two emission regions. For example, the first pixel region P1 includes a first transmissive region TA1, and the first transmissive region TA1 may include a first emission region G11 and a second emission region B12. Further, the second pixel region P2 may include a second transmissive region TA2, and the second transmissive region TA2 may include a third emission region G13 and a fourth emission region R14.

Herein, the first emission region G11 and the third emission region G13 may be regions that emit green (G) lights. The second emission region B12 may be a region that emits a blue (B) light. The fourth emission region R14 may be a region that emits a red (R) light. Accordingly, the transparent display device according to an embodiment of the present disclosure can express a same resolution with fewer sub-pixels as compared with an RGB structure.

Herein, the first emission region G11, the second emission region B12, the third emission region G13, and the fourth emission region R14 may have different areas. In this embodiment, the second emission region B12 may have the greatest area, and the first emission region G11 and the third emission region G13 may have the smallest areas. That is, the emission area of the fourth emission region R14 may be greater than the emission areas of the first emission region G11 and the third emission region G13, and the emission area of the second emission region B12 may be greater than the emission area of the fourth emission region R14.

Accordingly, even when the life or efficiency of the organic light emitting element disposed in the second emission region B12 is lower than the life or efficiency of the organic light emitting elements disposed in the other emission regions G11, G13, and R14, the life or emission efficiency of the transparent display device according to an embodiment of the present disclosure can be further improved since the second emission region B12 is, for example, designed to have the greatest area.

Meanwhile, even when the first to fourth emission regions G11, B12, G13, and R14 have different emission areas, the first and second transmissive regions TA1 and TA2 may have the same emission area. In this embodiment, a sum of the emission areas of the first emission region G11, the second emission region B12, and the first bank pattern 210 in the first transmissive region TA1 may be the same as a sum of the emission areas of the third emission region G13, the fourth emission region R14, and a third bank pattern 210a in the second transmissive region TA2. In other words, a sum of the emission areas of the first emission region G11 and the second emission region B12 in the first transmissive region TA1 is greater than a sum of the emission areas of the third emission region G13 and the fourth emission region R14 in the second transmissive region TA2. However, an emission area of the first bank pattern 210 disposed in the first transmissive region TA1 is smaller than an emission area of the third bank pattern 210a disposed in the second transmissive region TA2. As a result, the first transmissive region TA1 and the second transmissive region TA2 may have the same emission area.

The third bank pattern 210a may be formed of the same material and with the same height as the first bank pattern 210. However, a width Y of the third bank pattern 210a is greater than a width X of the first bank pattern 210. As a result, an area of the third bank pattern 210a may be greater than an area of the first bank pattern 210. That is, the emission areas can be determined by the first bank pattern 210 and the third bank pattern 210a. Accordingly, it is possible to easily control emission areas in consideration of the life and efficiency of the organic light emitting elements disposed in the emission regions.

Figure 6:
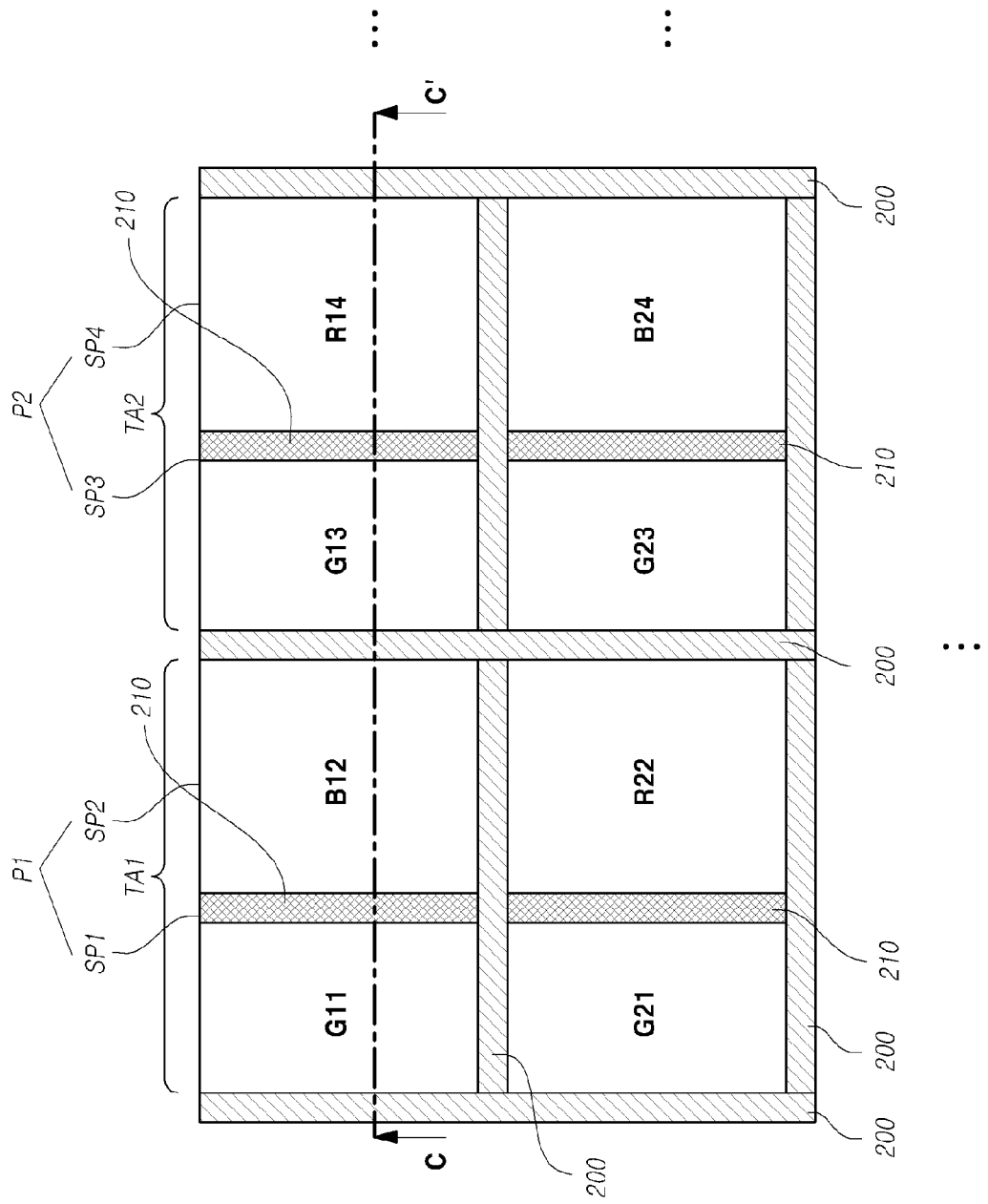
FIG. 6 is a plane view of a transparent display device according to a third exemplary embodiment of the present disclosure.
Figure 7:
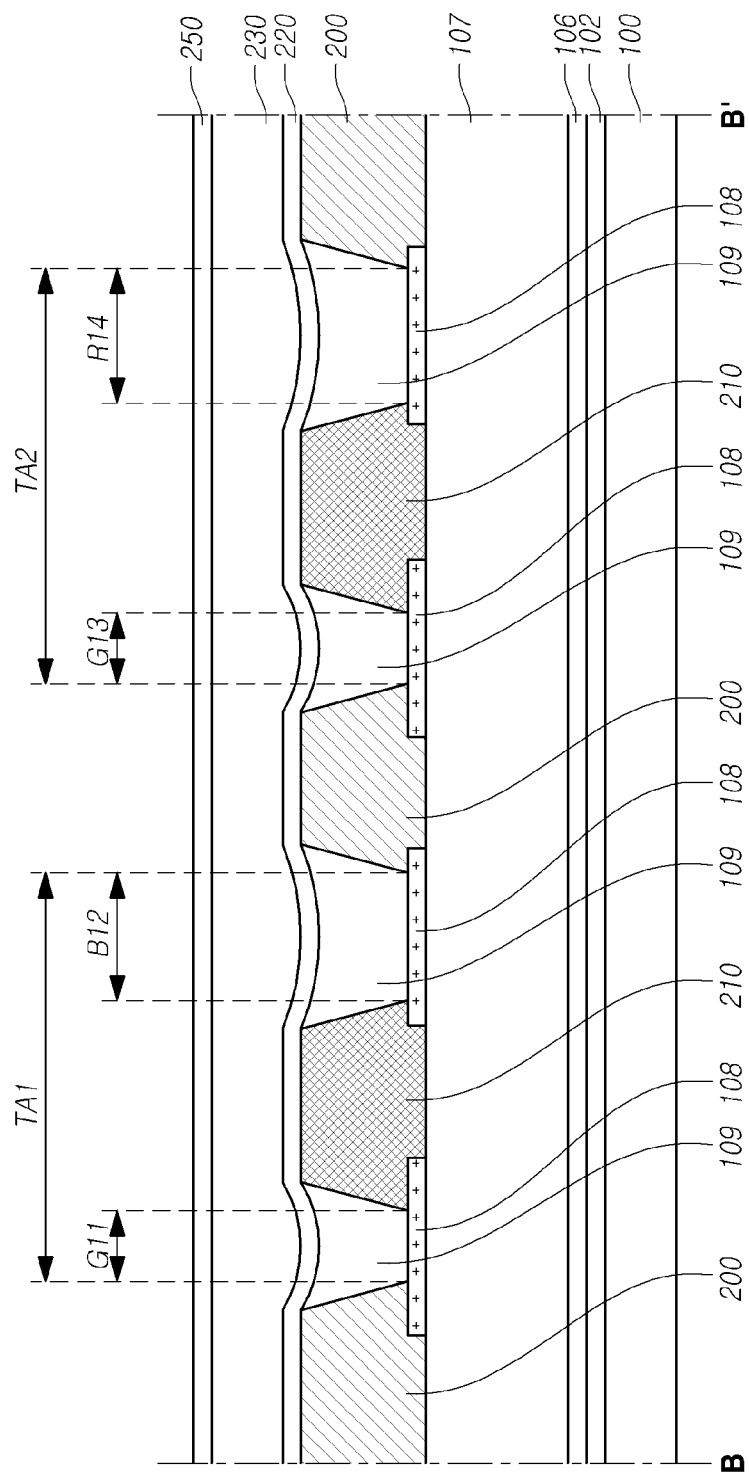
FIG. 7 is a cross-sectional view taken along a line C-C' of the transparent display device according to the third exemplary embodiment of the present disclosure.

Hereinafter, a transparent display device according to a third exemplary embodiment of the present disclosure will be described with reference to FIG. 6 and FIG. 7. FIG. 6 is a plane view of the transparent display device according to the third exemplary embodiment of the present disclosure. FIG. 7 is a cross-sectional view taken along line C-C' of the transparent display device according to the third exemplary embodiment of the present disclosure. The transparent display device according to the third exemplary embodiment may include the same components as those of the above-described exemplary embodiments. The redundant description thereof may be omitted herein. Further, like components are assigned like reference numerals.

Referring to FIG. 6 and FIG. 7, in the transparent display device according to the third exemplary embodiment of the present disclosure, one pixel region may include one transmissive region, and the one transmissive region may include two emission regions.

For example, a first pixel region P1 includes a first transmissive region TA1, and the first transmissive region TA1 includes a first emission region G11 and a second emission region B12. Further, a second pixel region P2 includes a second transmissive region TA2, and the second transmissive region TA2 includes a third emission region G13 and a fourth emission region R14.

Herein, the first emission region G11 and the third emission region G13 may be regions that emit green (G) lights. The second emission region B12 may be a region that emits a blue (B) light. The fourth emission region R14 may be a region that emits a red (R) light.

The first emission region G11 and the third emission region G13 may have the same emission area, and the second emission region B12 and the fourth emission region R14 may have the same emission area. Further, the emission areas of the first emission region G11 and the third emission region G13 may be smaller than the emission areas of the second emission region B12 and the fourth emission region R14.

Herein, the areas of the emission regions may be determined depending on a location of the first bank pattern 210. That is, it is possible to easily control emission areas of the emission regions depending on a location of the first bank pattern 210. Further, an area of the first bank pattern 210 disposed in the first transmissive region TA1 may be the same as an area of the first bank pattern 210 disposed in the second transmissive region TA2. As a result, the first transmissive region TA1 and the second transmissive region TA2 may have the same area.

Meanwhile, in the transparent display device according to the third exemplary embodiment of the present disclosure, the second emission region B12 and the fourth emission region R14 are designed to have the emission areas greater than the emission areas of the first emission region G11 and the third emission region G13. As a result, even if the life and efficiency of the organic light emitting element disposed in the second and fourth emission regions B12 and R14 is low, the life and emission efficiency of the transparent display device can be further improved.

Figure 8:
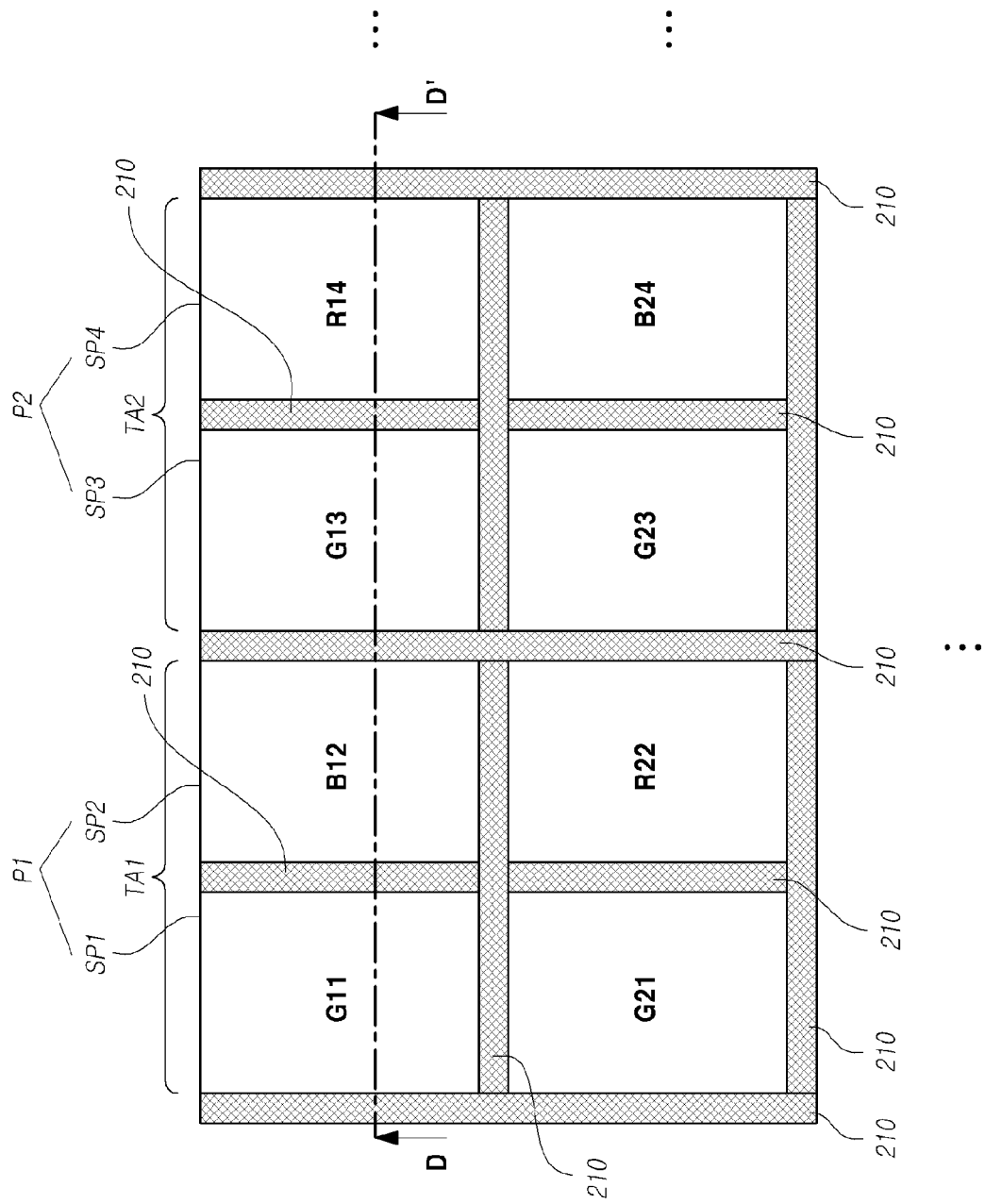
FIG. 8 is a plane view of a transparent display device according to a fourth exemplary embodiment of the present disclosure.
Figure 9:
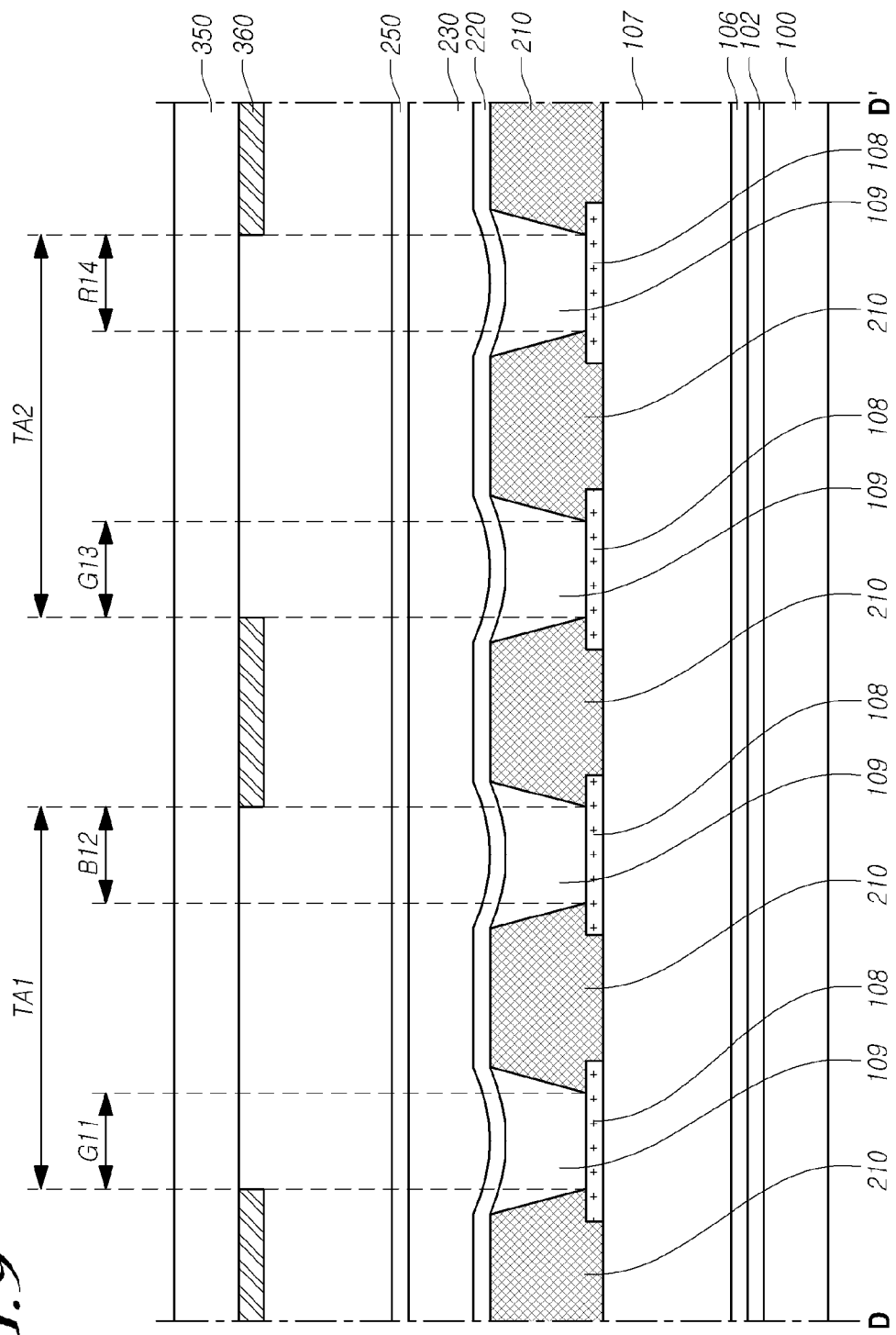
FIG. 9 is a cross-sectional view taken along a line D-D' of the transparent display device according to the fourth exemplary embodiment of the present disclosure.

Hereinafter, a transparent display device according to a fourth exemplary embodiment of the present disclosure will be described with reference to FIG. 8 and FIG. 9. FIG. 8 is a plane view of the transparent display device according to the fourth exemplary embodiment of the present disclosure. FIG. 9 is a cross-sectional view taken along line D-D' of the transparent display device according to the fourth exemplary embodiment of the present disclosure. The transparent display device according to the fourth exemplary embodiment may include the same components as those of the above-described exemplary embodiments. The redundant description thereof may be omitted herein for conciseness. Further, like components are assigned like reference numerals.

Referring to FIG. 8, the transparent display device according to the fourth exemplary embodiment of the present disclosure is different from the transparent display device (refer to FIG. 2) according to the first exemplary embodiment of the present disclosure in that a first bank pattern 210 formed of a transparent organic material is also disposed in a region where a second bank pattern formed of an opaque organic material is disposed. In other words, in the transparent display device according to the fourth exemplary embodiment of the present disclosure, a transparent bank pattern may also be disposed in a region where a circuit region and column lines are disposed.

As such, the first bank pattern 210 disposed in transmissive regions TA1 and TA2 is also disposed in a region where the circuit region and column lines are disposed. Thus, a process for forming a bank pattern on the circuit region and column lines can be simplified. In other words, the first bank pattern 210 disposed in the transmissive regions TA1 and TA2 and the first bank pattern 210 disposed on the circuit region and column lines can be formed at the same time, and thus, a process can be simplified.

In this embodiment, the first emission region G11, the second emission region B12, the third emission region G13, and the fourth emission region R14 have the same emission area, as illustrated FIG. 8. However, the transparent display device according to the fourth exemplary embodiment of the present disclosure is not limited thereto, and the emission regions G11, B12, G13, and R14 may respectively have different emission areas.

Referring to FIG. 9, a black matrix 360 may be disposed on one surface of a second substrate 350 disposed to face the first substrate 100. Thus, a region where the circuit region and the column lines are disposed can reduce or block a reflected light from metal electrodes and metal lines.

In the second substrate 350, the black matrix 360 may be disposed in a region corresponding to a region for the circuit region and the column lines disposed on the first substrate 100. In other words, the black matrix 360 may be disposed only in a region of the second substrate 350 except regions corresponding to the transmissive regions TA1 and TA2. Since the black matrix 360 is disposed only in a region except the transmissive regions TA1 and TA2, it is possible to reduce or block a reflected light from metal electrodes and metal lines without reducing the areas of the transmissive regions TA1 and TA2.

Figure 10:
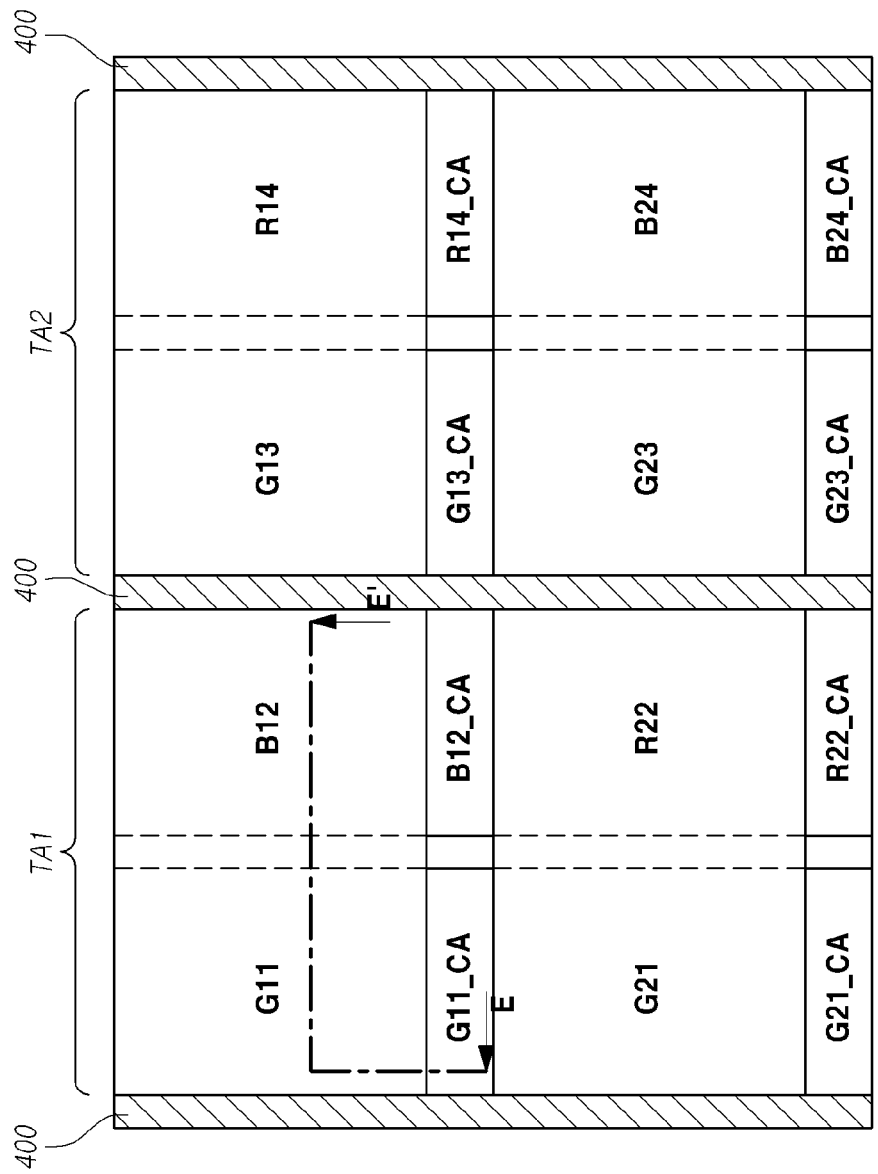
FIG. 10 is a plane view schematically illustrating a circuit region array of the transparent display device according to the first exemplary embodiment of the present disclosure.

Hereinafter, a circuit region array in each emission region of the transparent display device according to the first exemplary embodiment of the present disclosure will be described with reference to FIG. 10. FIG. 10 is a plane view schematically illustrating the circuit region array of the transparent display device according to the first exemplary embodiment of the present disclosure.

Referring to FIG. 10, in the transparent display device according to the first exemplary embodiment of the present disclosure, sub-pixel regions are defined by a plurality of gate lines and a plurality of data lines crossing each other. Herein, the plurality of gate lines may be disposed to be overlapped with circuit regions G11_CA, B12_CA, G13_CA, R14_CA, . . . of the transparent display device according to the first exemplary embodiment of the present disclosure. The plurality of data lines may be disposed in a column line region 400 of the transparent display device.

The circuit regions G11_CA, B12_CA, G13_CA, R14_CA, . . . may be disposed on a plurality of horizontal lines. In another aspect, a first circuit region G11_CA may be disposed adjacent to the first emission region G11 in a vertical direction. A second circuit region B12_CA may be disposed adjacent to the second emission region B12 in the vertical direction. A third circuit region G13_CA may be disposed adjacent to the third emission region G13 in the vertical direction. A fourth circuit region R14_CA may be disposed adjacent to the fourth emission region R14 in the vertical direction.

Herein, the plurality of circuit regions G11_CA, B12_CA, G13_CA, R14_CA, . . . may include the plurality of emission regions G11, B12, G13, R14, . . . , a plurality of thin film transistors, and a capacitor. For example, the plurality of circuit regions G11_CA, B12_CA, G13_CA, R14_CA, . . . may include a driving thin film transistor configured to drive an organic light emitting element, a switching thin film transistor configured to transfer a data voltage to the driving thin film transistor, and a storage capacitor configured to maintain a certain voltage during one frame.

However, the plurality of circuit regions G11_CA, B12_CA, G13_CA, R14_CA, . . . of the transparent display device according to an embodiment of the present disclosure are not limited thereto, and may further include one or more thin film transistor and capacitors, if desired.

As such, all circuits for the dual-type display device are disposed in the plurality of circuit regions G11_CA, B12_CA, G13_CA, R14_CA, . . . . Thus, an area of a transmissive region can be increased.

Also, the column line region 400 may include two data lines and one voltage line. Further, the column line region 400 may be disposed every two sub-pixels. As such, the column line region 400 is not disposed every sub-pixel but disposed every two sub-pixels. Thus, an area of a transmissive region of the transparent display device can be increased.

Figure 11:
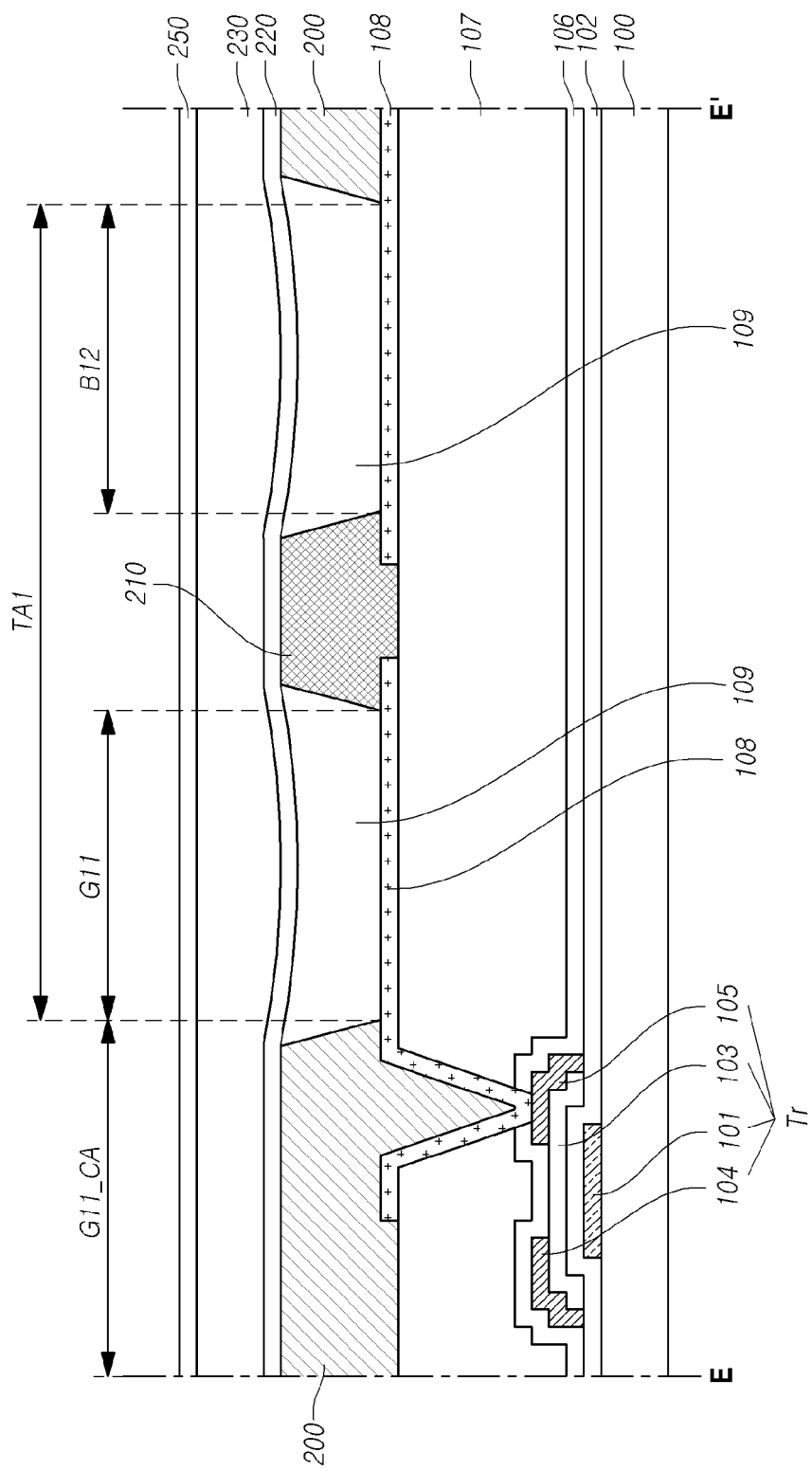
FIG. 11 is a cross-sectional view taken along a line E-E' of the transparent display device according to the first exemplary embodiment of the present disclosure.

The display device configured as described above will be described with reference to a cross-sectional view taken along line E-E' as illustrated in FIG. 11.

FIG. 11 is the cross-sectional view taken along line E-E' of the transparent display device according to the first exemplary embodiment of the present disclosure.

Referring to FIG. 11, in the transparent display device according to the first exemplary embodiment of the present disclosure, a thin film transistor Tr including a gate electrode 101, an active layer 103, a source electrode 104, and a drain electrode 105 is disposed on the first substrate 100. The thin film transistor Tr may be a driving thin film transistor configured to drive the organic light emitting element disposed in the first emission region G11.

The region where the thin film transistor Tr is disposed may be the circuit region G11_CA. Herein, one thin film transistor is disposed on the first substrate 100, as illustrated in FIG. 11. However, the first exemplary embodiment of the present disclosure is not limited thereto, and a plurality of thin film transistors and capacitors may be further included.

The first electrode 108 of the organic light emitting element in contact with the drain electrode 105 of the thin film transistor Tr is disposed on a flattening film 107. Both ends of the first electrode 108 may be respectively overlapped with the first bank pattern 210 and the second bank pattern 200. To be specific, one end of the first electrode 108 disposed in the transmissive region TA1 of the transparent display device may be overlapped with the first bank pattern 210 which is transparent. The other end of the first electrode 108 disposed in the circuit region G11_CA may be overlapped with the second bank pattern 200 which is opaque.

The first and second bank patterns 210 and 200 may define the emission regions G11 and B12 of the transparent display device. Further, the second electrode 220, the encapsulation layer 230, and the second substrate 250 may be disposed on the first and second bank patterns 210 and 200 and the organic light emitting layer 109. As such, the first bank pattern 210, which is transparent, is disposed in the transmissive region TA1 of the transparent display device. Thus, an area of the transmissive region TA1 of the transparent display device can be increased. Further, the second bank pattern 200, which is opaque, is disposed in the circuit region G11_CA. Thus, a reflected light from a plurality of metal electrodes and metal lines can be reduced or blocked.

The features, structures, effects, and the like described in the above exemplary embodiments are included in at least one exemplary embodiment and but are not limited to one exemplary embodiment. In addition, the features, structures, effects, and the like described in the respective exemplary embodiments may be executed by those skilled in the art while being combined or modified with respect to other embodiments. Accordingly, it will be understood that contents related the combination and modification will be included in the scope of the present disclosure.

Further, it should be understood that the exemplary embodiments described above should be considered in a descriptive sense only and not for purposes of limitation. It will be understood by those skilled in the art that various other modifications and applications may be made therein without departing from the scope of the appended claims. For example, respective components exhibited in detail in the exemplary embodiments may be executed while being modified.

What is claimed is:

1. A transparent display device comprising:
   a plurality of column lines and a plurality of horizontal lines crossing each other to define a plurality of pixel regions in a matrix, each column line including at least two data lines and a voltage line, and each horizontal line including a gate line;
   a first transparent electrode in each emission region;
   a transparent organic light emitting layer on the first electrode; and
   a second transparent electrode on the organic light emitting layer,
   wherein each pixel region includes a transmissive region and a circuit region, and wherein the transmissive region includes at least two emission regions that are divided by a first transparent bank pattern.

2. The transparent display device of claim 1, wherein one pixel region includes at least two sub-pixel regions.

3. The transparent display device of claim 2, wherein the first bank pattern is disposed between the two sub-pixel regions.

4. The transparent display device of claim 3, wherein the first bank pattern includes a transparent organic material.

5. The transparent display device of claim 1, wherein the first transparent electrode in each emission region is extended from the transmissive region to the circuit region.

6. The transparent display device of claim 1, wherein the first bank pattern includes a transparent organic material.

7. The transparent display device of claim 1, wherein the at least two emission regions have a same emission area.

8. The transparent display device of claim 1, wherein the at least two emission regions have different emission areas.

9. The transparent display device of claim 1, wherein the circuit region is disposed on a corresponding horizontal line.

10. The transparent display device of claim 1, further comprising a second bank pattern overlapping the circuit region.

11. The transparent display device of claim 10, wherein the second bank pattern includes an opaque material.

12. The transparent display device of claim 11, wherein the opaque material is an opaque organic material.

13. The transparent display device of claim 1, further comprising:
   a second substrate on which a black matrix is disposed in a region corresponding to the column lines and the circuit regions.

\* \* \* \* \*